United States Patent [19]

Matsuno et al.

[11] 4,422,034

[45] Dec. 20, 1983

[54] METHOD FOR MEASURING INSULATION RESISTANCE AND DEVICE THEREFOR

[75] Inventors: Tatsuji Matsuno, Kawasaki; Yosio Nomura, Fujisawa, both of Japan

[73] Assignee: Toyo Sushinki Kabushiki Kaisha, Kanagawa, Japan

[21] Appl. No.: 226,620

[22] Filed: Jan. 19, 1981

[30] Foreign Application Priority Data

| Jan. 22, 1980 [JP] | Japan | 55-6207 |
| Mar. 27, 1980 [JP] | Japan | 55-39926 |
| Apr. 9, 1980 [JP] | Japan | 55-47324 |

[51] Int. Cl.³ .............................................. G01R 31/02
[52] U.S. Cl. .................................................... 324/51
[58] Field of Search .................... 324/51; 361/41, 113

[56] References Cited

U.S. PATENT DOCUMENTS

| 3,800,189 | 3/1974 | Montz | 361/113 X |
| 3,801,871 | 4/1974 | Loh | 361/113 X |
| 3,976,987 | 8/1976 | Anger | 324/51 X |
| 4,053,815 | 10/1977 | Sircom | 361/42 OR |
| 4,066,950 | 1/1978 | Rumold | 324/51 OR |
| 4,075,675 | 2/1978 | Burkett | 361/113 X |
| 4,142,143 | 2/1979 | Daniel | 324/51 OR |
| 4,153,923 | 5/1979 | Graf | 324/51 X |
| 4,179,651 | 12/1979 | Vitins | 324/51 OR |
| 4,206,398 | 6/1980 | Janning | 324/51 OR |
| 4,348,708 | 9/1982 | Howell | 361/113 |

OTHER PUBLICATIONS

Kameoka: "Measuring High-Value Capacitors"-hp Journal-Mar. 72.
Maeda: "An Automatic, Precision 1 MHZ Digital LCR Meter" hp Journal-Mar. 74.
Electronics—Jul. 24, 1967-pp. 91-100.

Primary Examiner—Stanley T. Krawczewicz
Assistant Examiner—Jose M. Solis
Attorney, Agent, or Firm—Murray Schaffer

[57] ABSTRACT

A method for measuring and supervising an insulation resistance and stray capacitance against ground of a power supply line while the line is active condition. A frequency different from the main supply voltage is applied to the line and this voltage is detected by a coupling transformer and the insulation resistance and the stray capacitance can be obtained by operation work of the measured value.

9 Claims, 4 Drawing Figures

METHOD FOR MEASURING INSULATION RESISTANCE AND DEVICE THEREFOR

BACKGROUND OF THE INVENTION

The present invention relates to a method for measuring the insulation resistance in power supply lines and apparatus therefor.

Present practice for measuring the ground insulation of a low voltage power line (hereinafter simply referred to as "line") for terminal consumers is that the line is interrupted from the main supply of voltage and the ground insulation resistance (hereinafter referred to as simply insulation or insulation resistance) is determined by an insulation measuring meter such as a Megger (Tradename) and by using this measured value the insulation condition is judged. However, a method and device able to measure the insulation to the same extent of accuracy while the line is in use (hereinafter referred to as an active line) have been requested.

The ground leakage current in a line, in which one end of the secondary circuit of the transformer is earthed, returns to the ground wire and among such a leakage current, a charging current for the stray capacitance, between ground hereinafter referred to as stray capacitance, is included. This occurs even in a line having good insulation resistance. Accordingly, if the insulation is to be measured by utilizing the leakage current, it is necessary to detect only the leakage current caused from a bad insulation and by removing the component caused from the stray capacitance. Furthermore in a measurement using the leakage current returning into the ground wire, there are the following problems. Namely in a single phase 3-wire circuit, there is sometimes caused simultaneous bad insulation for the two non-grounded wires among the 3-wire circuit. In this case the leakage currents mutually compensate for each other in the ground wire so that a correct detection of bad insulation is not possible only from the measurement of the leakage current.

As known measuring methods for the insulation resistance, the followings are considered.

(a) A method for measuring the insulation resistance by measuring the dc current returning into the ground wire by inserting an auxiliary dc voltage source in series with the ground wire.

(b) A method for measuring the insulation resistance by detecting a returning current of a low frequency ac measuring current by inserting a low frequency ac voltage source in series with the ground wire and deriving the effective component caused by the insulation resistance in the current.

(c) A method for detecting the effective component in the current returning through the ground wire.

In the methods of (a) and (b), it is required to insert the measuring voltage source in series with the ground wire so that this might cause a possible high ground resistance. Also in a case of a ground short circuit accident, there is a danger of breakage or destruction of the inserted voltage source. These methods are troublesome in requiring much work in order to insert the measuring voltage source in the ground wire. The method (c) can not be used for a single phase 3-wire line by the reasons set forth above.

SUMMARY OF THE INVENTION

The present invention is to improve the above mentioned inconveniences of the known measuring methods for insulation of an active line.

The invention has the following features.

(1) Instead of inserting a measuring voltage source in series with the ground wire, a low frequency measuring voltage is applied to the ground wire via a separate transformer. The ground return current is measured by using a separate ZCT (zero phase current transformer). In this method, there is no need for installation work with the ground wire.

(2) The method does not include a factor tending to result in the rising of the ground resistance.

(3) The method can not only be applied to the single phase 3-wire circuit, but can be used for the measurement of the parallel composite value of insulation resistances of the non-grounded two circuits in a 3-wire circuit, as well as measurement for the insulation resistance in the individual lines thereof.

(4) The invention can be applied to a single phase 2-wire line as well as a three phase 3-wire line.

(5) A very stable measuring result can be expected by using a variable filter as the detecting filter for detecting the ground return current completely in phase with the measuring low frequency voltage applied to the ground wire.

(6) The measurement of the stray capacitance is also possible besides the measurement of the insulation resistance.

DESCRIPTION OF THE PREFERRED EMBODIMENT

The invention will now be explained by referring to the embodiments illustrated in the accompanying drawings.

At first an embodiment used for a single phase 3-wire circuit will be explained.

Figure 1:
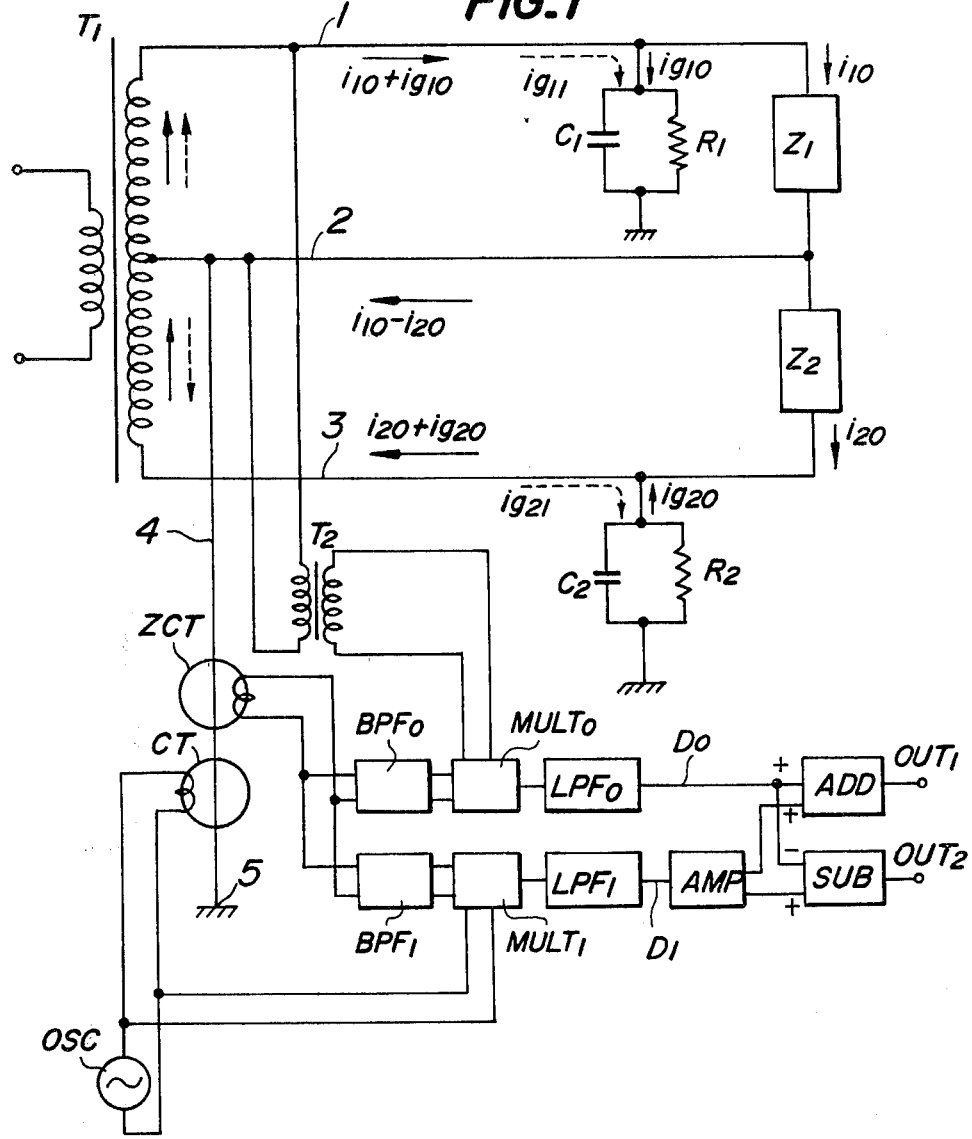
FIG. 1 is a circuit diagram partially in block form of the measuring circuit according to the present invention applied for a single phase 3-wire circuit.

Referring to FIG. 1, $T_1$ is a single phase 3-wire line transformer coupled with a circuit having non-grounded lines 1 and 3, a grounded neutral line 2, and a ground wire 4. The ground wire 4 is arranged to couple a zero phase current transformer ZCT by passing thereto or passing a number of its turns. $C_1$, $C_2$ and $R_1$, $R_2$ denote stray capacitances and insulation resistances (shown by concentrated constants) against ground of the non-grounded lines 1 and 3, respectively. $Z_1$ and $Z_2$ are the loads connected to the non-grounded lines 1 and 3 and the neutral line.

The currents of the main supply frequency of $f_0$ flowing through the loads $Z_1$ and $Z_2$ are assumed as $i_{10}$ and $i_{20}$. The leakage currents of the main frequency $f_0$ flowing through the non-grounded lines 1 and 3 are assumed as $ig_{10}$ and $ig_{20}$, respectively. A coupling transformer CT of the low frequency measuring voltage is provided to couple the ground wire, which is passed through the turns of the transformer. This coupling transformer CT may also act as an oscillating transformer of a low frequency oscillator or it is connected with a low frequency oscillator OCS as shown. The oscillator OSC oscillates at a frequency $f_1$ which is different from the main frequency $f_0$. A current having frequency $f_1$, is introduced into the ground wire 4 via the coupling transformer CT and flows into the non-grounded lines 1 and 3 as shown by the dotted line arrows and returns back to the ground point 5 as the leakage currents $ig_{11}$ and $ig_{21}$. Under the above condition, the output current ig of the zero phase current transformer ZCT becomes as follows.

$$ig = i_{10} + ig_{10} + ig_{11} - (i_{10} - i_{20}) - (i_{20} + ig_{20}) + ig_{21} = ig_{10} - ig_{20} + ig_{11} + ig_{21} \quad (1)$$

When we assume the voltage between the non-grounded lines 1 and 3 and the neutral line 2 having frequency $f_0$ as $V_0$ volt, the following relation exists.

$$\left. \begin{array}{l} ig_{10} = \dfrac{\sqrt{2} \, V_0}{R_1} \sin\omega_0 t + \sqrt{2} \, \omega_0 C_1 V_0 \cos\omega_0 t \\[1em] ig_{20} = \dfrac{\sqrt{2} \, V_0}{R_2} \sin\omega_0 t + \sqrt{2} \, \omega_0 C_2 V_0 \cos\omega_0 t \end{array} \right\} \quad (2)$$

Wherein: $\omega_0 = 2\pi f_0$

Further, it we assume the voltage of the low frequency voltage introduced or injected by the coupling transformer CT having the frequency $f_1$ between the neutral line 2 and the ground point 5 as $V_1$ volt, the following relation exists.

$$\left. \begin{array}{l} ig_{11} = \dfrac{\sqrt{2} \, V_1}{R_1} \sin\omega_1 t + \sqrt{2} \, \omega_1 C_1 V_1 \cos\omega_1 t \\[1em] ig_{21} = \dfrac{\sqrt{2} \, V_1}{R_2} \sin\omega_1 t + \sqrt{2} \, \omega_1 C_2 V_1 \cos\omega_1 t \end{array} \right\} \quad (3)$$

Wherein: $\omega_1 = 2\pi f_1$

The term ig in equation (1) may be rewritten by equations (2) and (3) as follows.

$$ig = \left(\dfrac{1}{R_1} - \dfrac{1}{R_2}\right) \sqrt{2} \, V_0 \sin\omega_0 t + (C_1 - C_2)\sqrt{2} \, \omega_0 V_0 \cos\omega_0 t + \left(\dfrac{1}{R_1} + \dfrac{1}{R_2}\right) \sqrt{2} \, V_1 \sin\omega_1 t + (C_1 + C_2)\sqrt{2} \, \omega_1 V_1 \cos\omega_1 t \quad (4)$$

When the output current of the zero phase current transformer ZCT is passed through band-pass-filters BPF0 and BPF1 having the center frequency $f_0$ and $f_1$, respectively, the outputs $ig_0$ and $ig_1$ of the respective filters may become as follows.

$$\left. \begin{array}{l} ig_0 = \left(\dfrac{1}{R_1} - \dfrac{1}{R_2}\right) \sqrt{2} \, V_0 \sin\omega_0 t + (C_1 - C_2)\sqrt{2} \, \omega_0 V_0 \cos\omega_0 t \\[1em] ig_1 = \left(\dfrac{1}{R_1} + \dfrac{1}{R_2}\right) \sqrt{2} \, V_1 \sin\omega_1 t + (C_1 + C_2)\sqrt{2} \, \omega_1 V_1 \cos\omega_1 t \end{array} \right\} \quad (5)$$

On the other hand, by deriving a voltage between the non-grounded line 1 and the neutral line 2 by stepping down the voltage by a transformer $T_2$, an alternating current voltage $V_0' = \sqrt{2} e_0 \sin\omega_0 t$ can be obtained.

By calculating the product between $V_0'$ and $ig_0$, we obtain the following.

$$V'_0 \times ig_0 = \left[\left(\dfrac{1}{R_1} - \dfrac{1}{R_2}\right) \sqrt{2} \, V_0 \sin\omega_0 t + (C_1 - C_2)\sqrt{2} \, \omega_0 V_0 \cos\omega_0 t \right] \times \sqrt{2} \, e_0 \sin\omega_0 t = \left(\dfrac{1}{R_1} - \dfrac{1}{R_2}\right) V_0 e_0 - \left[\left(\dfrac{1}{R_1} - \dfrac{1}{R_2}\right) \cos 2\omega_0 t - (C_1 - C_2)\omega_0 \sin 2\omega_0 t\right] V_0 e_0 \quad (6)$$

Accordingly, the dc component $D_0$ of the $V_0' \times ig_0$ is as follows.

$$D_0 = \left(\dfrac{1}{R_1} - \dfrac{1}{R_2}\right) V_0 e_0 \quad (7)$$

Wherein, $D_0$ is the active or effective component of the leakage current $ig_0$ having frequency $f_0$.

Further if we assume the voltage of the oscillator output $V_1'$ having the frequency $f_1$ is $e_1$ volt, the following can be obtained.

$$V'_1 = \sqrt{2} \, e_1 \sin\omega_1 t$$

Accordingly, the following may be obtained.

$$V'_1 \times ig_1 = \left[\left(\dfrac{1}{R_1} + \dfrac{1}{R_2}\right) \sqrt{2} \, V_1 \sin\omega_1 t + (C_1 + C_2)\sqrt{2} \, \omega_1 V_1 \cos\omega_1 t\right] \times \sqrt{2} \, e_1 \sin\omega_1 t = \quad (8)$$

-continued $$\left(\frac{1}{R_1}+\frac{1}{R_2}\right)V_1e_1 - \left[\left(\frac{1}{R_1}+\frac{1}{R_2}\right)\cos 2\omega_1 t - (C_1+C_2)\omega_1\sin 2\omega_1 t\right]V_1e_1$$

Accordingly, the dc component $D_1$ of the $V_1'xig_1$ is as follows.

$$D_1 = \left(\frac{1}{R_1}+\frac{1}{R_2}\right)V_1e_1 \qquad (9)$$

Wherein, $D_1$ is the active or effective component of the leakage current $ig_1$ having the frequency $f_1$.

Further, if the voltage $V_0$ and $V_1$ are assumed as constant, the values $V_0e_0$ and $V_1e_1$ are also constant values. We set these product values $V_0e_0$ and $V_1e_1$ as $A_0$ and $A_1$ respectively.

$$\left.\begin{array}{l}A_0 = V_0e_0 \\ A_1 = V_1e_1\end{array}\right\} \qquad (10)$$

Accordingly, by amplifying $D_1$ by $A_0/A_1$ times;

$$D_0 = \left(\frac{1}{R_1}-\frac{1}{R_2}\right)A_0 \qquad (7')$$

$$\frac{A_0}{A_1}D_1 = \left(\frac{1}{R_1}+\frac{1}{R_2}\right)A_0 \qquad (8')$$

From equations (7') and (8'), the following can be obtained.

$$D_0 + \frac{A_0}{A_1}D_1 = \frac{2}{R_1}A_0 \qquad (11)$$

$$\frac{A_0}{A_1}D_1 - D_0 = \frac{2}{R_2}A_0 \qquad (12)$$

By the above equations, the amount in inverse proportion to the insulation resistance for the respective non-grounded lines can be obtained. When an amount in inverse proportion to the parallel composite resistance is to be measured, only the $D_1$ in the equation (9) is derived by processing.

The measurement according to the method of the present invention can be carried out by a circuit as substantially shown in FIG. 1.

An output current from the zero phase current transformer ZCT is applied to two band-pass-filters BPF0 and BPF1 having the center frequency $f_0$ and $f_1$ respectively. At the outputs of the band-pass-filters BPF0 and BPF0, output currents $ig_0$ and $ig_1$ as expressed in the equation (5) are derived, respectively. On the other hand, at the output of the transformer $T_2$, an ac voltage corresponding to $V_0'$ is delivered. The outputs of the band-pass-filters BPF0 and BPF1 are applied to a first input of respective multipliers $M_0$ and MULT1. The output of the transformer $T_2$ is applied to the second input of the multiplier MULT0. An output coming from the low frequency oscillator OSC is applied to the second input of the multiplier MULT1. At the outputs of the multipliers MULT0 and MULT1, the currents represented by the equations (6) and (7) are obtained, respectively. These outputs of the multiplies MULT0 and MULT1 are applied to low-pass-filters $LPF_0$ and $LPF_1$ at whose outputs, the dc component $D_0$ and $D_1$ represented by the equations (7) and (9) are obtained. The output $D_1$ of the low-pass-filter $LPF_1$ is amplified by $A_0/A_1$ times in an amplifier AMP. The constants $A_0$ and $A_1$ are values expressed in the equation (10). At the output of the amplifier AMP, an output voltage $A_0/A_1.D_1$ represented by an equation (8') will be obtained. The output of the low-pass-filter $LPF_0$ and the output of the amplifier AMP are applied to an adder ADD and a subtractor SUB, respectively. At the output of the adder ADD, a voltage having the value $2/R_1.A_0$ expressed by the equation (11) is obtained. At the output of the subtractor SUB, a voltage $2/R_2.A_0$ expressed by the equation (12) is also obtained. These values are measured as representing the amount in inverse proportion to the insulation resistance of the non-grounded two lines.

In the aforementioned explanation, the zero phase current transformer ZCT is coupled or penetrated by the ground wire 4. However, the present invention is not limited to such an embodiment only. The zero phase current transformer ZCT may be coupled with the non-grounded line 1 or 3 or the neutral wire 2 and the same result can be obtained.

Furthermore, in the above explanation, the voltage $V_0$ between the non-grounded line and the neutral wire is assumed as constant. However, when the voltage $V_0$ fluctuates by the variation of the source voltage, the outputs of the adder ADD and the subtractor SUB will not provide a correct "measurement value in inverse proportion to the insulation resistance". In this case, a square circuit or the like may be connected in parallel to the output of the transformer $T_2$ so as to obtain a dc voltage in proportion to the square of voltage $V_0$ and using means for normalizing the outputs of the adder ADD and the subtractor SUB, the problem can be solved.

When only an amount in proportion to $1/R_1+1/R_2$, i.e. parallel resultant resistance of the insulation resistances, is required, the transformer $T_2$, the band-pass-filter BPF0, the multiplier MULT0, the low-pass-filter $LPF_0$, the adder ADD, the subtractor SUB, and the amplifier AMP may be removed from the circuit shown in FIG 1, an amount in proportion to $1/R_1+1/R_2$ as expressed in the equation (9) is obtained at the output of the low-pass-filter $LPF_1$.

In the aforementioned embodiment, the present invention had been explained in application with a single phase 3-wire circuit. However, the method according to the principle of the present invention may equally be applied to a single phase 2-wire circuit and a three phase 3-wire circuit.

A brief explanation for applying the method of the present invention to a three phase circuit formed of a three phase transformer, in which one end of the secondary winding is grounded, will be made hereinafter. As is apparent from the foregoing explanation, the leakage current obtained at the output of the zero phase current transformer being coupled with the ground wire, consists of an effective current or an active current flowing through the insulation resistance of the circuit to be measured and of an ineffective or a reactive current flowing through the stray capacitance of the circuit. Accordingly, in case of a three phase circuit, an amount in proportion to the insulation resistance and the stray capacitance of each individual non-grounded line can easily be obtained by detecting separately the leakage current of the main frequency $f_0$ included in the output of the zero phase current transformer and that of the frequency $f_1$ injected via the ground wire which is also included therein, by obtaining first an amount in proportion to the active or effective component and the reactive or ineffective component for the respective phases of the leakage current in the frequency $f_0$ of each non-grounded line, then by obtaining an amount in proportion to the active or effective component and the reactive or ineffective component in the leakage current having frequency $f_1$, and by applying an arithmetic operation for the amounts obtained. The above will easily be understood from the principle of the present invention as has been mentioned in the foregoing.

The leakage current component having frequency $f_1$ of the measurement low frequency voltage $V_1$ (volt) introduced in the ground wire through the transformer CT is expressed by $ig_1$ in the equation (5) and this component is in general a very weak current. The voltage $V_1$ may be at the most a few volts so that the current $ig_1$ may be a very small value such as a few $\mu A$ even when we assume the insulation resistance as 1 $M\Omega$. Accordingly, the band-pass-filter BPF1 for detecting the $ig_1$ of the equation (5) from the output of the zero phase current transformer ZCT is required to have a sufficient selecting characteristic and a sufficient stability for accurate operation. This means that the variation of the center frequency and the phase characteristic of the band-pass-filter BPF1 should be limited as low as possible. Also the fluctuation of the frequency of the oscillator OSC should be kept as stable as possible.

It is not always economical to stabilize the characteristics of the band-pass-filter and that of the oscillator resulting in making the apparatus expensive.

Accordingly, this problem has been solved in the system of the present invention in the following manner.

Figure 2:
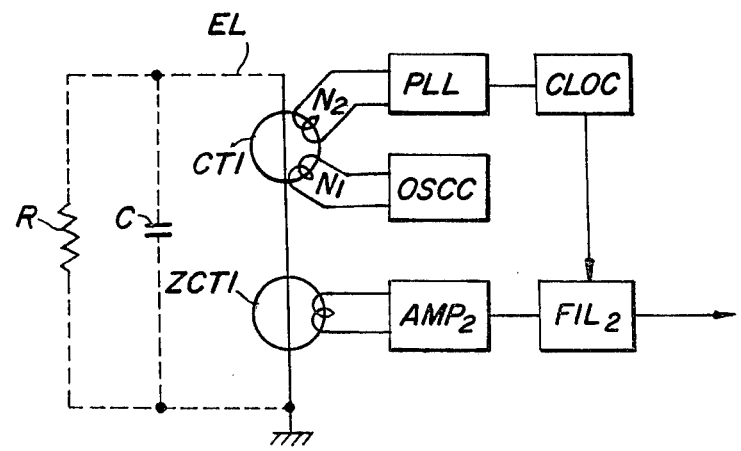
FIG. 2 is a block diagram for explaining the operation of the coupling oscillator and the band-pass-filter in the circuit of the invention.

Now referring to FIG. 2, $CT_1$ is a transformer coupled with the ground wire EL and is a kind of low frequency oscillation transformer used for the measurement. This transformer, however, may be a coupling transformer applied with an output of an oscillator at power up condition. $ZCT_1$ is a zero phase current transformer coupled with the ground wire EL and is same as the transformer ZCT shown in FIG. 1. OSCC is a low frequency oscillating circuit connected to the transformer $CT_1$ by a winding $N_1$. The output obtained from the zero phase transformer $ZCT_1$ is amplified by an amplifier $AMP_2$ and then coupled with a variable tuning filter FIL2.

In the circuit diagram, R is the insulation resistance and C is the stray capacitance both represented by concentrated constant.

A second winding $N_2$ provided in the transformer $CT_1$ for deriving the voltage having the same phase with the low frequency voltage but induced in the ground wire EL. This winding may be substituted by the winding $N_1$. An output of the winding $N_2$ is applied to a phase synchronizing circuit PLL having the frequency multiplying function. When we assume the oscillation frequency of the low frequency oscillating circuit as $f_1$, a signal having the frequency $nf_1$ phase synchronized with the output of the turn $N_2$ is obtained at the output of the circuit PLL. (wherein; n is an integer) a circuit PLL having such frequency multiplying function, is widely known. For instance, the integrated circuit CD4046A (Tradename) of RCA Inc can be employed. The construction and the function thereof are well known so that a more detailed explanation is omitted. CLOC is a clock signal circuit formed mainly of counters and produces a control signal for the variable tuning filter FIL2. In this case, the center frequency of the selecting characteristic of the filter FIL2 is a function of the clock frequency and is determined by the clock frequency. The center frequency of the filter FIL2 always coincides with the frequency $f_1$ of the oscillating circuit OSCC together with the phase thereof. By the aforementioned construction, only the component having frequency $f_1$ is accurately derived from the leakage current flowing through the zero phase current transformer $ZCT_1$ at the output of the filter FIL2. In the output of the zero phase current transformer $ZCT_1$, a large current component of the main frequency $f_0$ is also included. However, since the filter FIL2 may have a very large Q value, the influence of the component of the frequency $f_0$ can be removed completely. For such a filter FIL2, a digital filter disclosed in "Electronics" July 24, 1967 pp 91-100 can be used and a detailed explanation thereof is omitted.

Figure 3:
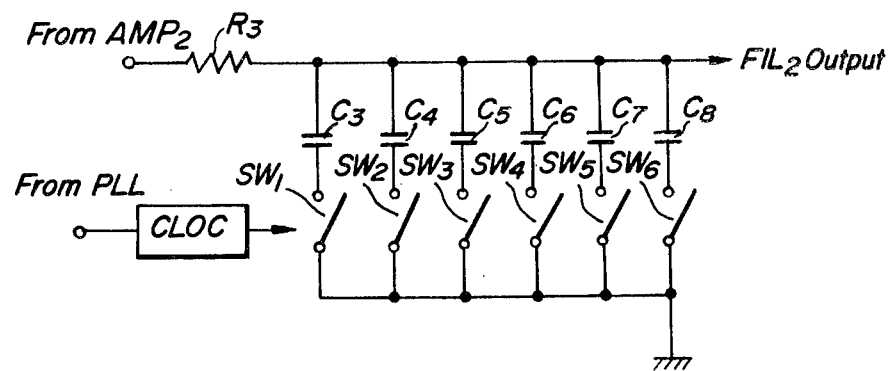
FIG. 3 is a circuit diagram of the band-pass-filter used in the circuit of the present invention.

This filter FIL2 is also called as an "N path filter" and which has its basic construction as shown in FIG. 3. The filter comprises a resistor $R_3$, a plurality of capacitors $C_3$ to $C_8$ and a number of switches $SW_1$ to $SW_6$. This embodiment shown in FIG. 3 illustrates a case of $n=6$ and the capacitors $C_3$ to $C_8$ are all of indentical value. ($C_3 = C_4 = \ldots = C_8$) The switches $SW_1$, $SW_2 \ldots SW_6$ are arranged to operate in this sequence one at a time when the clock pulse of frequency $nf_1$ is applied. By this operation, the filter characteristic having the center frequency $Nf_1$ ($N=1, 2 \ldots$) can be obtained at the output of the filter FIL2. The band width of 3 dB having each center frequency becomes:

$$1/\pi n R_3 C_3$$

Accordingly, at the output of the filter FIL2, a component having frequency $f_1$ is obtained. The filter itself does not cause a phase shift the frequency $f_1$.

In order to obtain a value related to the insulation resistance R, for instance an amount in counter-proportion thereof, it is required to derive a co-phase component with the output voltage of the oscillating circuit OSCC from the frequency component in the leakage current obtained at the output of the filter FIL2. For this purpose, a product of the component having frequency $f_1$ of the output of the filter FIL2 and an output of the winding $N_1$ or $N_2$ may be obtained in a known manner. When we select the frequency $f_1$ sufficiently lower than the main frequency $f_0$, a low-pass-filter having sufficiently small phase shift at the frequency $f_1$ is inserted between the amplifier $AMP_2$ and the filter FIL2 and the frequency components having value higher than the main frequency $f_0$ are removed from the input of the filter FIL2. By this the S/N ratio of the output of the filter FIL2 can be improved further. This is by a reason that the leakage current due to the main frequency $f_0$ or its higher harmonic components in the leakage current has the general tendency to become very large compared with that caused by the frequency $f_1$.

In FIG. 2, R and C coupled by dotted line designate the insulation resistance and the stray capacitance of a single phase 2-wire circuit, a single phase 3-wire circuit, a three phase 3-wire circuit or the like in concentrated constants. In circuits other than a single phase 2-wire circuit, these values correspond to a parallel composite value of insulation resistances of the both non-grounded circuits and that of the stray capacitances of the both non-grounded circuits.

Although it has not been previously explained by reference to the specific embodiment, when the stray capacitances are to be measured, a voltage having 90° phase shift from the injected voltage having the frequency $f_1$ should be derived from the leakage current and a product between said voltage and the injected voltage may be obtained by operation. As for an example, in a circuit construction shown in FIG. 2, a voltage having 90° phase shift from the output voltage of the oscillator OSCC is produced and the product between this voltage and the output of the filter FIL2 is formed and the dc component thereof is derived through the low-pass-filter and the object is obtained.

The insulation resistances, and the stray capacitances are decided by the phase and the amplitude of a component of the measuring frequency $f_1$ in the leakage current. However, in the method of the present invention, since the center frequency of the filter FIL2 is always decided in synchronism with the oscillation frequency of the oscillator OSCC so that even if the oscillating frequency $f_1$ causes a phase shift, the center frequency of the filter FIL2 correctly follows thereto including the phase thereof. Accordingly, the signal having the component of the frequency $f_1$ may always be detected at the output of the filter FIL2 regardless of the phase shift. When we assume that a dual-T type circuit network or the like well known at present is used in place of the filter FIL2, the center frequency and the phase thereof may shift each time the circuit constants vary due for example to variation of the temperature or the like. Accordingly, both the phase and amplitude of the component having frequency $f_1$ in the output of the filter show deviation and it may become difficult to obtain a correct signal. Furthermore in such a case, the influence of the frequency variation becomes larger according to a higher quality factor Q of the filter and a more technical difficulty may be considered. The "N path filter" shown in FIG. 3 uses as its clock source a generally stable quartz oscillator or the like in case of a receiving filter. But even with such stable clock device, when it shows frequency deviation between the signal sources, a correct output can not be obtained and the phase and the amplitude of the filter output result in shifting.

In a method of the present invention, the work required for the measurement is only to couple the injection transformer and the zero phase transformer with the ground wire. Accordingly, by arranging the injection transformer and the zero phase transformer to be of separate iron core construction, the measurement of the insulation resistance is always possible without any additional work for the ground wire.

Furthermore in the method of the present invention, the injected low frequency signal is not inserted in the ground wire in series with it contrary to the conventional construction. Therefore, the injected voltage into the ground wire is considerably small (for instance about 1 V at $f_1 = 20$ HZ), but by using the filter having a special function as mentioned above, a sufficiently high Q filter function (for instance Q=200–500) can be realized so that a highly stable measurement value can be obtained.

In case of a single phase 2-wire circuit and a three phase 3-wire circuit, an accurate direct measurement of the leakage current is possible by using the main frequency $f_0$. In such a case, at the input of the phase synchronizing circuit PLL shown in FIG. 2, the circuit voltage itself of the circuit to be measured is directly applied after stepping down the voltage in the same manner as with the transformer $T_2$ shown in FIG. 1. In this case, the component having the frequency $f_0$ is detected very stably at the output of the filter FIL2. Also in this case, a slight variation of the main frequency will not cause any trouble since the filter FIL2 will follow exactly such a variation. When the individual insulation resistance of each non-grounded circuit is to be measured as in the case of FIG. 1, two leakage currents are required; namely: that of the main frequency $f_0$ and the injecting oscillation frequency $f_1$. However, this problem can be solved by adding to the circuit shown in FIG. 2 an "N path filter" system for deriving the component of the main frequency $f_0$ separately.

As has been mentioned in the foregoing, the transformer CT or $CT_1$ may also be formed as the oscillating transformer for forming the oscillating circuit. Also it may be formed as a coupling transformer by applying power up system for the general low frequency oscillator output. The latter case may result in a somewhat larger power consumption compared with the former case. In the foregoing explanation the voltage waveform of the oscillating circuit is assumed to be of sinusoidal one. But this may also be a pulsating waveform. By using pulsating wave, the oscillating circuit becomes simple. However, it should be noted that in the leakage current higher harmonic components of the frequency $f_1$ may be included. For removing such higher harmonic components, the output of the zero phase current transformer is first passed through a low-pass-filter or the like.

Application of such technical means may easily be conceived by those skilled in the art. However, the following special attention is required.

As can be seen from the item $ig_1$ in the equation (1), the leakage current is represented by a sum of that caused by the insulation resistance expressed by the first item and that caused by the stray capacitance expressed by the second item. The component due to stray capacitance has 90° phase shift compared with that caused by the insulation resistance. In general the leakage current caused by the stray capacitance is much larger than that caused by the insulation resistance, although there is a certain variation by the construction of the circuit.

For instance we may consider a case of;
insulation resistance
  $R = 500$ k$\Omega$,
stray capacitance
  $C = 2$ $\mu$F,
  $f_1 = 20$ HZ,
the leakage current caused by the stray capacitance is about 24 times larger than that caused by the insulation resistance.

$$\left(\frac{\omega_1 C}{\frac{1}{R}} = \omega_1 CR = 2\pi \times 20 \times 2 \times 10^{-6} \times 10^5 = 8\pi\right)$$

Due to this fact the measurement error for the insulation resistance may become larger.

Hereinafter, a method for obtaining an accurate measurement over a wide range of insulation resistance by excluding said large influence of the leakage current caused by the stray capacitance will be explained.

Figure 4:
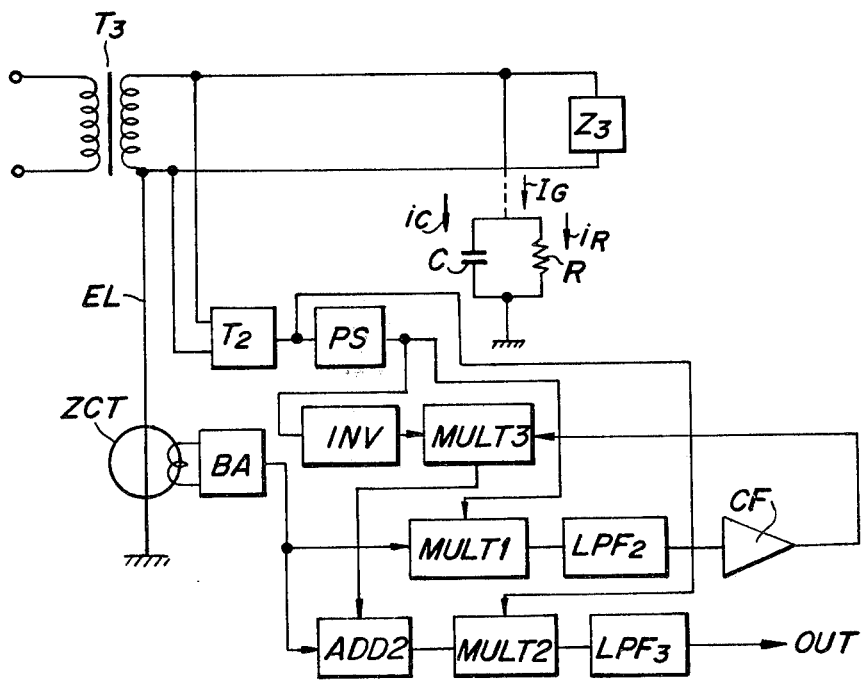
FIG. 4 is a block diagram of another embodiment for suppressing the leakage current caused by the stray capacitance.

In order to simplify the explanation, an application for a single phase 2-wire circuit will be explained by referring to FIG. 4. It is apparent that the method explained hereinafter may equally be applied for circuits other than the single phase 2-wire circuit.

Secondary voltage $V_0$ (volt) of a transformer $T_3$ is applied to the line and a load $Z_3$ is connected thereto. In the leakage current $I_G$ flowing through the ground wire EL, a current $i_R$ flowing through an insulation resistance to be measured and a current $i_C$ flowing through the stray capacitance C are contained. Accordingly the following current $I_G$ returns to the ground wire EL.

$$I_G = i_R + i_C \tag{13}$$

$$= \frac{\sqrt{2}}{R} V_0 \sin\omega_0 t + \sqrt{2} \, \omega_0 C V_0 \cos\omega_0 t$$

Through a zero phase current transformer ZCT coupled with the ground wire, a current corresponding to said current $I_G$ flows and this current is amplified by a buffer amplifier BA.

By stepping down the main source voltage $V = \sqrt{2} V_0 \sin\omega_0 t$ by the transformer $T_2$ and an ac voltage $V_0' = \sqrt{2} e_0 \sin\omega_0 t$ is obtained.

By obtaining a product between the leakage current $I_G$ and $V_0'$, the following is derived.

$$V_0' \times I_G = \left(\frac{\sqrt{2}}{R} V_0 \sin\omega_0 t + \sqrt{2} \, \omega_0 C V_0 \cos\omega_0 t\right) \times \tag{14}$$

$$\sqrt{2} \, e_0 \sin\omega_0 t$$

$$= \frac{V_0 e_0}{R} - \frac{V_0 e_0}{R} \cos 2\omega_0 t + \omega_0 C V_0 e_0 \sin 2\omega_0 t$$

Namely the dc component of $V_0' \times I_G$ is $V_0 e_0/R$, so that if $V_0$ is constant, a value in inverse proportion to the insulation resistance R is obtained as had been mentioned in the foregoing.

In practice the value of $i_R$ is substantially smaller than $i_C$ as mentioned above. Accordingly, if the sensitivity of the measuring device is increased the multiplier causes error under an influence of said large $i_C$.

For this reason it is preferable to sufficiently suppress the value of $i_C$ to maintain it at smaller value before the multiplying operation under the equation (13) is effected.

The present invention offers means for automatically effecting this suppression which will be explained hereinafter.

Namely, the voltage $\sqrt{2} e_0 \cos\omega_0 t$ obtained by phase shifting of said voltage $V_0'$ by a 90° phase shifter PS is further applied to a polarity reversing circuit INV and a following compensation current having its amplitude a is obtained.

$$i = -\sqrt{2} \, a \cos\omega_0 t$$

By adding this current with $I_G$ of equation (13) by an adder ADD2 the following can be obtained.

$$I_G + i = \frac{\sqrt{2}}{R} V_0 \sin\omega_0 t + \sqrt{2} \, (\omega_0 C V_0 - a)\cos\omega_0 t \tag{15}$$

By taking a product between $I_G$ of equation (13) and $V_0' = \sqrt{2} e_0 \cos\omega_0 t$ $$I_G \times \sqrt{2} \, e_0 \cos\omega_0 t = \left(\frac{\sqrt{2}}{R} V_0 \sin\omega_0 t + \sqrt{2} \, \omega_0 C V_0 \cos\omega_0 t\right) \times \tag{16}$$

$$\sqrt{2} \, e_0 \cos\omega_0 t$$

$$= C\omega_0 e_0 V_0 + \omega_0 C e_0 V_0 \cos 2\omega_0 t + \frac{e_0 V_0}{R} \sin 2\omega_0 t$$

We may check the dc component D of the equation (16);

$$D = C\omega_0 e_0 V_0 \tag{17}$$

This is a value in proportion to the stray capacitance. By arranging the value of a to be in close proximity of $\omega_0 C V_0$, the second term of the equation (15) approaches zero. Namely, by automatically deciding the value of a in proportion to the dc component D of said $I_G \times \sqrt{2} e_0 \cos\omega_0 t$, the leakage current component caused by the stray capacitance and included in $I_G + i$ of equation (15) can be made sufficiently small. For this purpose, a product between the output of the 90° phase shifter PS and the output of the buffer amplifier BA is obtained by a multiplier MULT1 and by applying the output therefrom to a low-pass-filter LPF2, a dc voltage corresponding to the equation (17) is obtained. By arranging the system to get $1/e_0^2$ times of the output of the low-pass-filter LPF2 by a coefficient circuit CF, a value $C\omega_0 V_0/e_0$ is obtained at the output thereof. This output of the coefficient circuit CF is applied to one input of a multiplier MULT3. The output of the polarity inverting circuit INV is applied to another input of the multiplier MULT3. By this a signal corresponding to;

$$-\sqrt{2} \, C\omega_0 V_0 \cos\omega_0 t$$

is obtained at the output of the multiplier MULT3. Accordingly, by adding this output of the multiplier MULT3 and the output of the buffer amplifier BA in an adder ADD2, a signal corresponding to equation (15) but having sufficiently small second item is obtained therefrom. By obtaining a product between the output of adder ADD2 and the output of the transformer $T_2$ in a multiplier MULT2 and by applying the output to a low-pass-filter LPF3 to derive dc component thereof, a signal corresponding to $V_0 e_0/R$ can be obtained.

In this automatic adjustment, since the component $i_c$ is small in the output of the adder ADD2, the output of the adder ADD2 may be rectified to obtain a same result.

The result of various measurements taken in an active condition of the line according to the method of the present invention can be used in security supervision of the electric installations. Namely, if the measured insulation resistance value does not reach a security standard an alarm may be started, for instance. The present invention may effectively be used in a remote supervision system or more particularly as an insulation measuring sensor.

Although an explanation was omitted in the foregoing, the basic idea of the present invention is applied not only to a measurement of a parallel composite value of the insulation resistance of each line of a three phase 3-wire circuit, but it may equally be applied for the measurement of each individual line. Therefore the invention is quite convenient for practical use.

What is claimed is:

1. A method for the measuring insulation resistance of a grounded supply line, in which one end of a secondary circuit, to which a main frequency $f_0$ is fed, is grounded via a ground wire, comprising the steps of applying a low voltage of a frequency $f_1$, different from the main frequency $f_0$, into the ground wire through a transformer coupled thereto, detecting separately the leakage current of the frequency $f_0$ and the leakage current of the frequency $f_1$, both said current leakages being included in the output of a zero phase transformer coupled with said ground wire, obtaining a component of the leakage current of the frequency $f_0$ and a component of the leakage current of the frequency $f_1$, and deriving an amount in inverse proporytion to the insulation resistance of each non-grounded line by using an arithmetic operation of said components while the line is in active condition.

2. A method for measuring insulation resistance as claimed in caim 1, wherein the transformer injecting the frequency $f_1$ into the ground wire is an oscillation transformer having said frequency $f_1$.

3. A method for measuring insulation resistance as claimed in claim 1, further comprising the steps of deriving a dc component, which is the product of a component of the frquency $f_0$, at the output of the zero phase transformer by a voltage having 90° phase shift from the line voltage obtaining a voltage by the product of said dc component by the voltage having 90° phase shift from the line voltage, and obtaining a difference from said voltage and an output of the zero phase current transformer so that a leakage current caused by stray capacity in the leakage current is automatically suppressed.

4. A method for measuring insulation resistance as claimed in claim 1, further comprising the steps of deriving dc component, which is the product of a component of frequency $f_1$, at the output of a zero phase transformer by a voltage having 90° phase shift from said low voltage, obtaining a voltage by the product of said dc component by the voltage having 90° phase shift from the said low frequency voltage, and obtaining a difference from said voltage and an output of the zero phase current transformer so that a leakage current caused by stray capacity in the leakage current is automatically suppressed.

5. A method for measuring insulation resistance of a grounded supply line, in which one end of a secondary circuit, to which a main frequency $f_0$ is fed, is grounded via a ground wire, comprising the steps of applying a voltage of a frequency $f_1$, different from main frequency $f_0$, into the ground wire through a transformer coupled thereto, detecting separately of a leakage current of the frequency $f_0$ the leakage current of the frequency $f_1$, both said current leakages being included in output of a zero phase transformer coupled with said ground wire, obtaining an effective component of the leakage current of said frequency $f_0$ and an effective component of the leakage current of said frequency $f_1$, and deriving an amount in inverse proportion to parallel composite value of insulation resistances of the non-grounded line from only one of said effective components.

6. A method for measuring insulation resistance as claimed in claim 5, wherein the transformer injecting the frequency $f_1$ into the ground wire is an oscillation transformer having said frequency $f_1$.

7. A method for measuring insulation resistance as claimed in claim 5, further comprising the steps of deriving a dc component which is the product of a component of frequency $f_0$, at the output of the zero phase transformer by a voltage having 90° phase shift from the line voltage, obtaining a voltage by the product of said dc component by the voltage having 90° phase shift from the line voltage, and obtaining a difference from said voltage and an output of the zero phase current transformer so that a leakage current caused by stray capacity in the leakage current is automatically suppressed.

8. A method for measuring insulation resistance as claimed in claim 5, further comprising the steps of deriving a dc component which is product between a component of frequency $f_1$, at the output of a zero phase transformer by a voltage having 90° phase shift from the said low frequency voltage, obtaining a voltage by the product between said dc component by the voltage having 90° phase shift from the said low frequency voltage, and obtaining a difference from said voltage and an output of the zero phase current transformer so that a leakage current caused by stray capacity in the leakage current is automatically suppressed.

9. A device for measuring insulation resistance of a grounded supply line, in which one end of secondary circuit is grounded via a ground wire comprising;
an oscillator for generating a low frequency $f_1$ which is different from a main frequency $f_0$ to be fed to the line,
a coupling transformer for coupling said frequency $f_1$ generated from the oscillator to the ground wire of the line,
a zero phase current transformer coupled with said ground wire for deriving leakage current having frequency components of $f_0$ and $f_1$,
a band-pass-filter for passing said main frequency $f_0$ coupled with an output of the zero phase transformer,
a multiplier fed with an output of the band-pass-filter for the frequency $f_0$ at one of its input and fed with a voltage in proportion to the line voltage of frequency $f_0$ and for producing multiplied product thereof,
a low-pass-filter fed with an output of said multiplier to derive a dc component of the leakage current having frequency $f_0$ therefrom,
a band-pass-filter for passing said frequency $f_1$ also coupled with said output of the zero phase transformer,
a multiplier fed with an output of the band-pass-filter for the frequency $f_1$ at one of its input and fed with the oscillator voltage having frequency $f_1$ for producing multiplied product thereof,
a low-pass-filter fed with an output of said multiplier to derive a dc component of the leakage current having frequency $f_1$ therefrom, and
arithmetic units for applying operation for the derived dc components to obtain an amount in counter proportion to the desired insulation resistance of the individual line.

* * * * *